United States Patent [19]

Rothermel

[11] Patent Number: 5,036,233
[45] Date of Patent: Jul. 30, 1991

[54] INTEGRATED SEMICONDUCTOR CIRCUIT HAVING A UNIDIRECTIONAL SEMICONDUCTOR COMPONENT FOR PREVENTING SATURATION OF BIPOLAR TRANSISTORS

[75] Inventor: Albrecht Rothermel, Mülheim, Fed. Rep. of Germany

[73] Assignee: Telefunken Electronic GmbH, Heilbronn, Fed. Rep. of Germany

[21] Appl. No.: 382,065

[22] Filed: Jul. 14, 1989

[30] Foreign Application Priority Data

Jul. 20, 1988 [DE] Fed. Rep. of Germany ....... 3824694

[51] Int. Cl.[5] ............................................. H03K 17/60
[52] U.S. Cl. .................................. 307/570; 307/560; 307/446
[58] Field of Search ............... 307/443, 446, 300, 544, 307/555, 560, 570

[56] References Cited

U.S. PATENT DOCUMENTS

| 4,118,640 | 10/1978 | Ochi et al. | 307/237 |
| 4,345,171 | 8/1982 | Harris, Jr. | 307/560 |
| 4,356,416 | 10/1982 | Weischedel | 307/570 |
| 4,616,146 | 10/1986 | Lee et al. | 307/446 |
| 4,638,186 | 1/1987 | Mclaughlin | 307/570 |
| 4,740,722 | 4/1988 | Furuhat | 307/570 |
| 4,746,817 | 5/1988 | Banker et al. | 307/446 |
| 4,755,697 | 7/1988 | Kinzer | 307/300 |
| 4,769,560 | 9/1988 | Tani et al. | 307/300 |
| 4,779,014 | 10/1988 | Masuoka et al. | 307/446 |
| 4,813,020 | 3/1989 | Iwamura et al. | 307/570 |
| 4,845,386 | 7/1989 | Ueno | 307/570 |

FOREIGN PATENT DOCUMENTS

| 0093086 | 11/1983 | European Pat. Off. | |
| 2246331 | 3/1973 | Fed. Rep. of Germany | 307/446 |
| 3709383 | 9/1988 | Fed. Rep. of Germany | |
| 2149603 | 6/1985 | United Kingdom | 307/446 |

OTHER PUBLICATIONS

Lohstroh et al., "Temperature Behavior of the Volage Swings and the Static Noise Margins of ISL and STL", 8-82 Benima, RCA Technical Notes—Transistor Saturation Control, 3-64.
"Nonsaturating Logic Circuit", J. Hong et al., IBM Tech. Disclosure, vol. 14, No. 5, Oct. 1971, p. 1592.
IEEE J. Solid-State Circuits, Bd. 23, No. 1, Feb. 88, p. 5-11.
Electronic; Bd. 16, Aug. 8, 1986, pp. 78-80, 82.
Bauelemente der Halbleiter-Elektronik; Rudolf Müller.

Primary Examiner—Stanley D. Miller
Assistant Examiner—Terry D. Cunningham
Attorney, Agent, or Firm—Spencer & Frank

[57] ABSTRACT

In digital circuit technology, bipolar transistors are advantageously used for switching thanks to their high mutual conductance. Since a transistor operated in the saturation state has a retarded switching behavior, saturation must be avoided for rapid switching processes.

In Schottky diodes, saturation is avoided by connecting a Schottky diode parallel to the base-collector barrier layer.

However, the manufacture of Schottky diodes in integrated circuit technology entails additional process steps.

The circuit in accordance with the invention avoids these additional process steps by replacing the Schottky diode with a unidirectional semiconductor element composed of field-effect transistors.

BICMOS technology processes permitting monolithic integration or bipolar and MOS transistors are particularly suitable for manufacture of the circuit.

13 Claims, 3 Drawing Sheets

INTEGRATED SEMICONDUCTOR CIRCUIT HAVING A UNIDIRECTIONAL SEMICONDUCTOR COMPONENT FOR PREVENTING SATURATION OF BIPOLAR TRANSISTORS

BACKGROUND OF THE INVENTION

The invention relates to an integrated semiconductor circuit for rapid switching processes having at least one input and one output and a bipolar transistor operated in an emitter connection between whose collector electrode and base electrode a unidirectional semiconductor element is arranged.

In digital circuit technology, bipolar transistors are advantageously used for switching. Thanks to their high mutual conductance, they can supply a large output current rise with a small input voltage rise.

The dynamic behaviour of bipolar transistors is determined by the change of the stored charges. A transistor operated in the saturation state and having a high stored charge in the base has a retarded switching behaviour. For this reason, saturation of the bipolar transistors must be avoided for rapid switching processes.

In so-called Schottky transistors, saturation is avoided by connecting a Schottky diode parallel to the base-collector barrier layer (See A. Müller, "Bauelemente der Halbleiter-Elektronik", Springer-Verlag, 3rd edition, p. 249 ff.).

Since Schottky diodes have substantially lower threshold voltages than pn-junctions, the current flows predominantly through the Schottky diode in the case of parallel connection, and not through the collector-base junction of the bipolar transistor. Unlike the pn-junction in the transistor, Schottky diodes are majority carrier components in which forward biasing does not lead to additional charge storage, for which reason the switching speed of the array is increased in the case of parallel connection.

In integrated circuit technology, the manufacture of Schottky diodes requires additional process steps, thereby increasing the manufacturing time and also production costs. A further mask must be made to structure the Schottky contact. A further metal must be introduced into the process, since the aluminum used in the usual integration process is not suitable for the Schottky contact. Deposition of the metal entails a photoresist coating process, exposure, development, photoresist etching, and metal etching. Immersion-type doping must be low and precisely checked for a Schottky contact. Since the manufacture of as small as possible structures requires heavy doping, the use of a Schottky diode militates against a structure reduction.

SUMMARY OF THE INVENTION

The object of the invention is to provide a semiconductor circuit for rapid switching processes in which the saturation of bipolar transistors is reliably prevented and which requires no additional process steps for the manufacture of integrated circuits.

The above and other objects are achieved by an integrated semiconductor circuit having at least one input and an output, a first bipolar transistor being operated in an emitter circuit, and unidirectional semiconductor circuit means, connected between the collector electrode and the base electrode of the bipolar transistor, for preventing saturation of the bipolar transistor wherein the unidirectional semiconductor means includes first and second field-effect transistors. According to the present invention, the source electrodes of the first and second field-effect transistors are connected to the input and the base electrode of said first bipolar transistor; the drain electrode of the first field-effect transistor is connected to a current supply source, and the gate electrode and the drain electrode of the first field-effect transistor are connected to the gate electrode of the second field-effect transistor so that the first field-effect transistor controls the current supplied to the second field-effect transistor. And, the drain electrode of the second field-effect transistor is connected to the collector electrode of the output and the first bipolar transistor.

According to an aspect of the invention, the unidirectional semiconductor element comprises two field-effect transistors, which are so connected that the current from the current source Ib flows off via the field-effect transistor 2 in the case of low collector-emitter voltage (e.g. 0.4 V) of the bipolar transistor 3, so that the base current is reduced and the bipolar transistor cannot enter the saturated state.

Since the principal task of the first field-effect transistor 1 connected as a diode is to provide a constant control voltage for the second field-effect transistor 2, it can be replaced according to another embodiment of the invention by a constant reference voltage source. This embodiment of the circuit has the advantage that it manages with less chip area.

According to another aspect of the invention, the bipolar transistor is supplied with current via three field-effect transistors 4, 5, 6. This reduces the demands placed on the constant current sources Ib, Ik for the base and collector current. The field-effect transistors 4, 5, 6 can be connected to the operating voltage connections VDD1.

In an advantageous embodiment of the integrated semiconductor circuit according to the invention, a second bipolar transistor 2 is connected between the output and the collector contact of transistor 3. An array of this type is in a position to supply higher currents at the output. This is necessary if a further circuit of greater capacity (e.g. long conducting paths on the chip) is to be fed with the output signal.

According to a further aspect of the invention, the hybrid transistor circuit serves as a read amplifier for a logic network with inputs A to F formed, for example, from field-effect transistors 8 to 13. Even a small voltage change in these transistors is sufficient to switch the array. Since the slight voltage change is very quickly achieved, the switching process takes place very rapidly.

The field-effect transistors 1 and 2 of the circuit are advantageously designed, according to one embodiment of the invention, as n-channel transistors, and the bipolar transistor 3 as an npn-transistor. This allows for the greater mobility of the electrons in semiconductors compared with those of holes. The field-effect transistors 4, 5, 6 controlling the current supply of bipolar transistor 3 must be correspondingly designed as p-channel transistors so that they can be operated with constant gate-source voltage.

The circuit according to the invention is designed with the known methods of BICMOS technology permitting monolithic integration of bipolar and MOS transistors.

The semiconductor circuit in accordance with the invention can be used advantageously in rapid digital circuit technology with bipolar transistors and field-effect transistors.

Since no Schottky diodes are required, additional process steps in the manufacture of the circuit are dispensed with. Nevertheless, saturation of the bipolar transistors is reliably avoided and a high switching speed thereby ensured.

Because of the high mutual conductance of the circuit determined by bipolar transistor 3, only a small voltage rise of the input signal is necessary for switching. The diode characteristic of the bipolar transistor between its base and emitter connections results in an automatic limitation of the input signal rise to the range between 0 V and 0.7 V. On the output side, the circuit supplies a large current rise and can therefore feed further circuits of high capacity. Since the arrangement of field-effect transistors 1 and 2 represents a current inverter, it is independent of any absolute fluctuations of the component properties, and the two transistors must only have the same properties relative to one another.

BRIEF DESCRIPTION OF THE DRAWINGS

Three embodiments of the semiconductor circuit are shown in the drawings and are described in greater detail in the following.

DESCRIPTION OF THE PREFERRED EMBODIMENTS

Figure 1A:
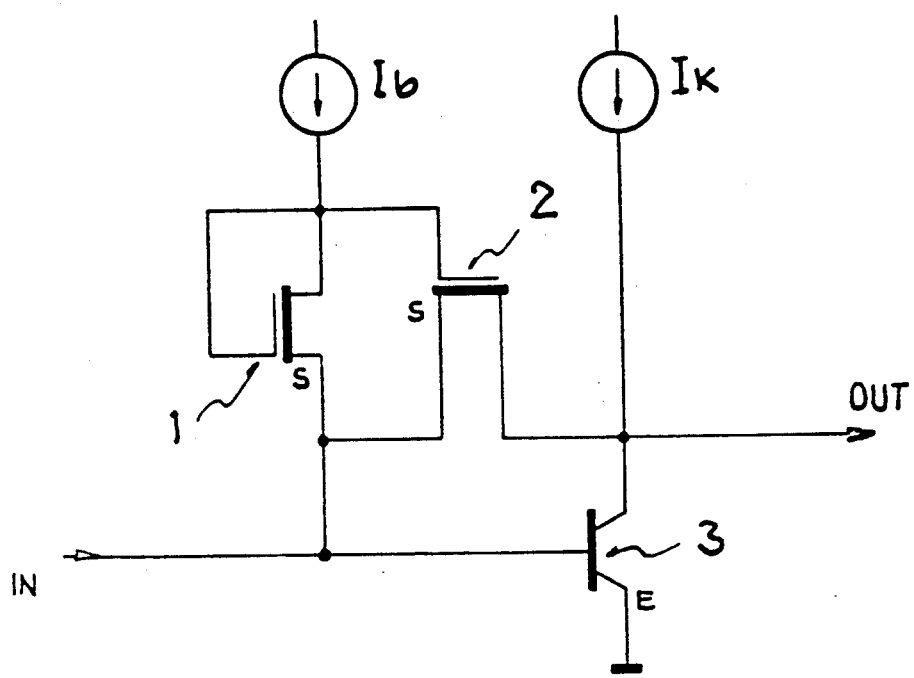
FIGS. 1a and 1b shows, in schematic, a circuit for avoidance of saturation in bipolar transistors according to the invention.

The circuit in FIG. 1a comprises an npn-bipolar transistor 3 and two n-channel field-effect transistors 1 and 2. The current supply is designated with Ik for the collector current source of bipolar transistor 3 and with Ib for the base current source of bipolar transistor 3.

Figure 1B:
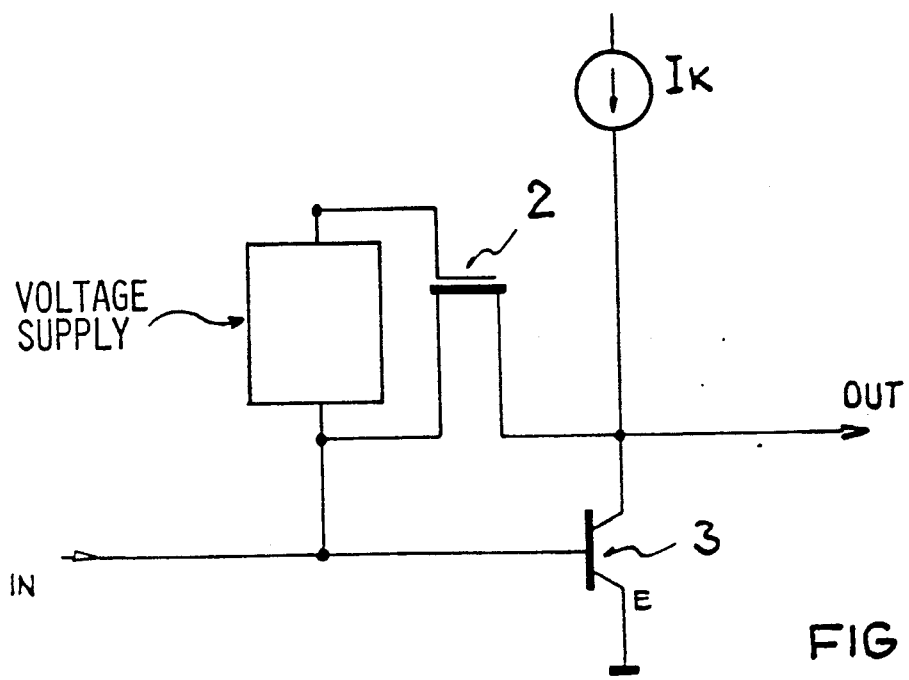

Field-effect transistor 2 is connected by the source and drain electrodes to the collector and base electrodes of bipolar transistor 3. If bipolar transistor 3 is blocking, an additional base current flows through transistor 2, so that the entire current flowing via the input connection is greater than Ib. If the input then becomes high-resistance, transistor 3 starts to switch on while the collector voltage decreases. As long as the collector-base voltage is greater than the effective gate voltage of transistor 2, the base current remains approximately constant. If the collector voltage is now reduced to the extent that the collector-base voltage reverses, part of the current Ib starts to flow via transistor 2 and the collector-emitter path of bipolar transistor 3. This causes the base current of transistor 3 to become smaller and to decrease to Ib. With the correct dimensions, saturation can thereby be completely prevented. Field-effect transistor 1 connected as a diode, between the source and gate electrodes of transistor 2, supplies a constant control voltage for transistor 2. In another embodiment according to the invention, as shown in FIG. 1b, the field-effect transistor 1 can be replaced by a constant reference voltage source.

Figure 2:
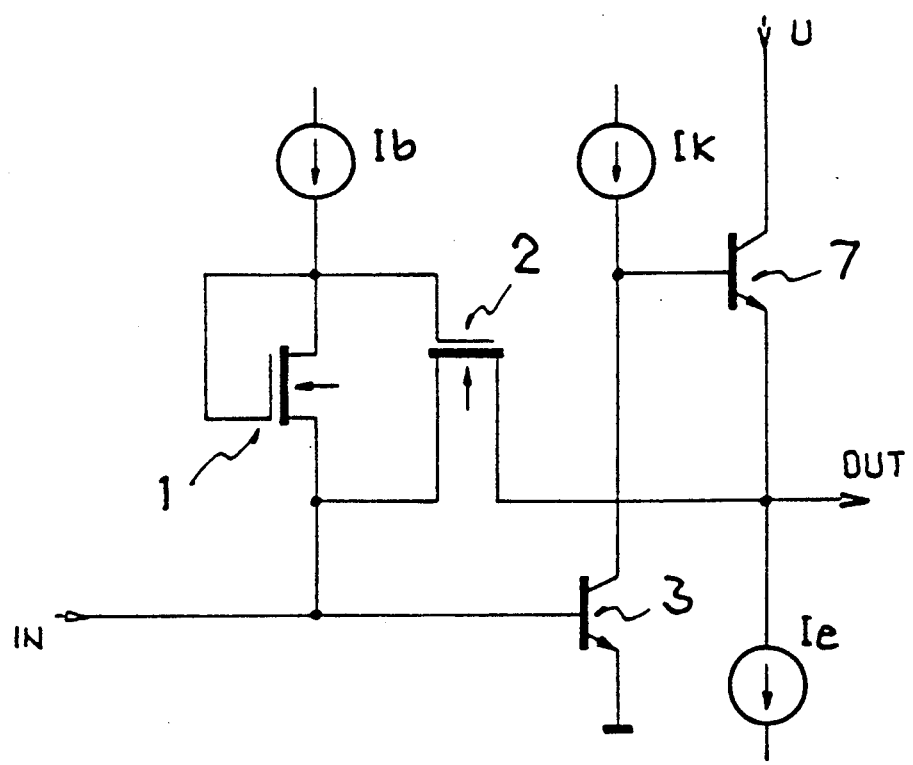
FIG. 2 shows, in schematic, a circuit in accordance with FIG. 1a and including a second bipolar transistor connected behind it.

In the semiconductor circuit in FIG. 2, an additional bipolar transistor 7 is connected between the collector electrode of bipolar transistor 3 and the drain electrode of field-effect transistor 2. Its emitter current supply is designated Ie. This variant is advantageous when the output is to supply high currents, for example in order to operate a high capacity. The other properties of the original circuit are preserved.

Figure 3:
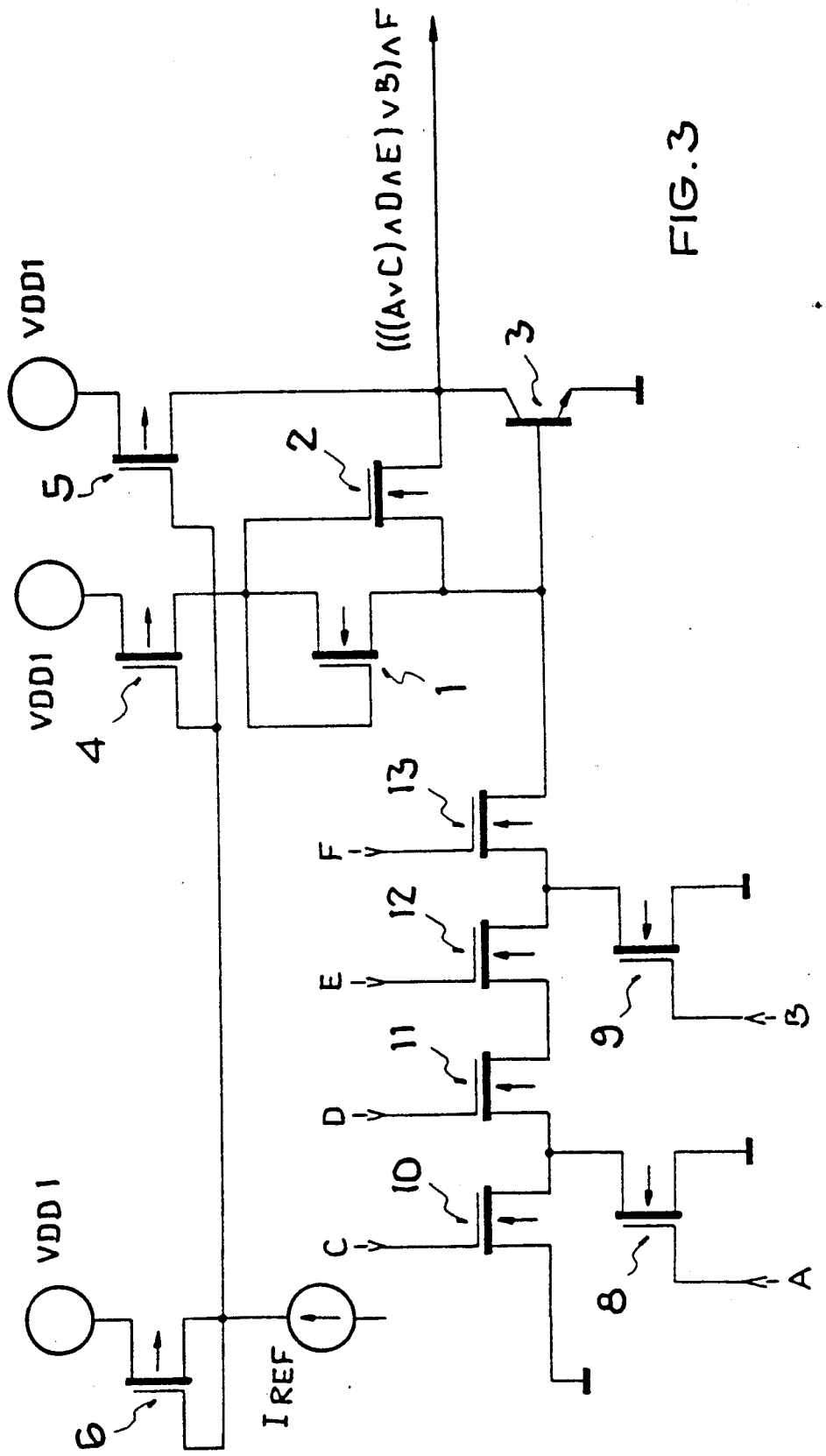
FIG. 3 shows an application of the circuit according to the invention as a read amplifier for a logic network.

In FIG. 3, the circuit in accordance with the invention is used as a read amplifier for a logic network constructed of field-effect transistors 8 to 13. The inputs are designated A to F. The logic network performs the function:

$$(((A \vee C) \wedge D \wedge E) \vee B) \wedge F.$$

By the arrangement of transistors 1 to 3, the voltage rise in the logic network remains limited to a diode conducting-state voltage (0.7 V), thereby achieving a high switching speed.

The p-channel field-effect transistors 4, 5 and 6 serve to set the base and collector currents of bipolar transistor 3. Here, transistor 6 determines the absolute size of the sum of collector and base currents, and transistors 4 and 5 the ratio of collector and base current. The voltage of these transistors is supplied via the operating voltage VDD1, while the reference current source IREF ensures the constancy of the current supply.

The following dimensions have been determined for the channels of the field-effect transistors for an optimum avoidance of saturation:

| Transistors 1 and 2 | channel width | 30 μm, |
| --- | --- | --- |
|  | channel length | 2.5 μm; |
| Transistor 4 | channel width | 25 μm, |
|  | channel length | 2.5 μm; |
| Transistor 5 | channel width | 150 μm, |
|  | channel length | 2.5 μm; |

It must be expressly pointed out that these dimensions apply for a specific embodiment and are exemplary of several dimensions which operate in accordance with the present invention. Other ratios can also lead to an optimum saturation avoidance. BICMOS technology processes permitting monolithic integration of bipolar and MOS transistors are particularly suitable for manufacture of the circuit in accordance with the invention.

What is claimed is:

1. In an integrated semiconductor circuit having at least one input and an output, a first bipolar transistor with a base electrode, a collector electrode and an emitter electrode, coupled to a reference level, and unidirectional semiconductor circuit means, connected between the collector electrode and the base electrode, for preventing saturation of said first bipolar transistor; the improvement wherein said unidirectional semiconductor circuit means comprises:

first and second field-effect transistors, each field-effect transistor having a gate electrode, a source electrode and a drain electrode and being arranged so that the source electrodes of said first and second field-effect transistors are connected to said input and said base electrode of said first bipolar transistor; the drain electrode of said first field-effect transistor is connected to a current supply; the gate electrode and the drain electrode of said first field-effect transistor are connected to the gate electrode of said second field-effect transistor so that said first field-effect transistor controls the current supplied to said second field-effect transistor; and the drain electrode of said second field-effect transistor is connected to said output and the collector electrode of said first bipolar transistor.

2. An integrated semiconductor circuit according to claim 1, wherein said current supply comprises a reference current source and means for controlling current supplied to said first bipolar transistor including a first additional field-effect transistor, having a source electrode connected to an operating voltage source, a gate electrode connected to said reference current supply and a drain electrode connected to the drain electrode of said first field-effect transistor.

3. An integrated semiconductor circuit according to claim 2, wherein said controlling means further includes a second additional field effect transistor transistor and a third additional field effect transistor transistor, each additional transistor having a gate electrode, a source electrode, and a drain electrode; the source electrodes and the gate electrodes of said second and third additional transistors being connected to said operating voltage source and said reference current supply, respectively; the drain electrode of said second additional transistor being connected to said current supply source, and said drain electrode of said third additional transistor being connected to the collector of said bipolar transistor.

4. An integrated semiconductor circuit according to claim 3, wherein said second additional transistor controls the total amount of current supplied to the base and collector of said first bipolar transistor, said first additional transistor controls a base current supplied to the base of said first bipolar transistor and said third additional transistor controls a collector current supplied to the collector of said first bipolar transistor thereby controlling the ratio of base and collector currents supplied to said first bipolar transistor.

5. An integrated semiconductor circuit according to claim 3, wherein said first and second field-effect transistors are n-channel transistors, and said first bipolar transistor is a npn-transistor, and the additional field-effect transistors are p-channel transistors.

6. An integrated semiconductor circuit according to claim 1, further comprising a second bipolar transistor connected between the collector electrode of the first bipolar transistor and the output, said second bipolar transistor having a base electrode, a collector electrode coupled to a bias voltage and an emitter electrode and wherein the base electrode of said second bipolar transistor is connected to the collector electrode of said first bipolar transistor and the emitter electrode of said second bipolar transistor to the drain electrode of the second field-effect transistor.

7. An integrated semiconductor circuit according to claim 1, wherein said integrated semiconductor circuit comprises a logic circuit in combination with a logic network having at least one input and an output, said input of the circuit being connected to said output of said logic network.

8. An integrated semiconductor circuit according to claim 1, wherein said first and second field-effect transistors are n-channel transistors, and said first bipolar transistor is a npn-transistor.

9. An integrated semiconductor circuit according to claim 1, wherein the circuit is designed in BICMOS technology.

10. In an integrated semiconductor circuit having at least one input and one output, a bipolar transistor including a base electrode, a collector electrode and an emitter electrode coupled to a reference level, and unidirectional semiconductor element means, connected between the collector electrode and base electrode, for preventing saturation of said bipolar transistor; the improvement wherein said semiconductor circuit means comprises:

a field-effect transistor having a gate electrode, a source electrode and a drain electrode, the source electrode being connected to said input and the base electrode of said bipolar transistor and the drain electrode being connected to said output and the collector electrode of said bipolar transistor; and a constant reference voltage source, connected between the source and gate electrodes of said field-effect transistor, for supplying a constant control voltage to said field-effect transistor.

11. In an integrated semiconductor circuit having at least one input and an output, and a bipolar transistor with a base electrode, a collector electrode and an emitter electrode coupled to a reference level, the improvement comprising:

means for preventing saturation of said bipolar transistor including:

a field-effect transistor having a gate electrode, a source electrode and a drain electrode, the source electrode being connected to said input and the base electrode of said bipolar transistor and the drain electrode being connected to said output and the collector electrode of said bipolar transistor; and means for supplying a reference voltage, connected between the source and gate electrodes of said field effect transistor.

12. An integrated semiconductor circuit according to claim 11, wherein said reference voltage supply means comprises a voltage supply field-effect transistor having a source electrode, a gate electrode and a drain electrode, the gate and drain electrodes of said voltage supply transistor being connected to a current source and the gate electrode of said field-effect transistor, the source electrodes of said voltage supply transistor and said field-effect transistor being connected to the base of said bipolar transistor.

13. An integrated circuit according to claim 11, wherein said reference voltage supply means comprises a constant reference voltage source which supplies a constant control voltage to said field-effect transistor.

* * * * *